United States Patent [19]

Tamura et al.

[11] Patent Number: 4,810,473
[45] Date of Patent: Mar. 7, 1989

[54] MOLECULAR BEAM EPITAXY APPARATUS

[75] Inventors: Naoyuki Tamura, Kudamatsu; Hideaki Kamohara, Ibaraki; Norio Kanai; Kazuaki Ichihashi, both of Kudamatsu, all of Japan

[73] Assignee: Hitachi, Ltd., Tokyo, Japan

[21] Appl. No.: 127,622

[22] Filed: Nov. 30, 1987

Related U.S. Application Data

[63] Continuation of Ser. No. 894,864, Aug. 8, 1986, abandoned.

[30] Foreign Application Priority Data

Aug. 9, 1985 [JP] Japan ................. 60-174103

[51] Int. Cl.$^4$ ............................................. C30B 35/00
[52] U.S. Cl. .................................. 422/247; 118/500; 118/719; 118/730
[58] Field of Search ............... 422/247; 118/500, 715, 118/719, 726, 729, 730, 733, 720; 414/217, 221, 222; 148/DIG. 169; 156/610, 611, 612, 614, DIG. 103

[56] References Cited

U.S. PATENT DOCUMENTS

| | | | |
|---|---|---|---|
| 3,641,973 | 2/1972 | Shrader | 118/733 |
| 3,921,788 | 11/1975 | Roberson, Jr. et al. | 118/730 |
| 4,009,680 | 3/1977 | Fengler | 118/730 |
| 4,181,544 | 1/1980 | Cho | 156/614 |
| 4,308,756 | 1/1982 | Robinson et al. | 118/733 |
| 4,412,771 | 11/1983 | Gerlach et al. | 414/217 |
| 4,498,416 | 2/1985 | Bouchaib | 118/500 |
| 4,605,469 | 8/1986 | Shih et al. | 118/729 |

FOREIGN PATENT DOCUMENTS

| | | | |
|---|---|---|---|
| 0132538 | 5/1984 | European Pat. Off. | 118/719 |
| 2095704 | 10/1982 | United Kingdom | |

OTHER PUBLICATIONS

IBM Technical Disclosure Bulletin, "Report for Pyrolytic Vapor Deposition on Thin Films", vol. 16, No. 4, 9/73, S. Zirinsky.

Primary Examiner—John Doll
Assistant Examiner—R. Bruce Breneman
Attorney, Agent, or Firm—Antonelli, Terry & Wands

[57] ABSTRACT

In a molecular beam epitaxy apparatus in accordance with the present invention, transfer means for transferring substrates, which have been transferred from an introduction chamber, to a growth chamber and for transferring the substrates after the growth of a film, which have been transferred from the growth chamber, to a discharge chamber consists of a rotary disc which supports thereon a plurality of substrates and transfers them to the growth chamber and then to the discharge chamber, and all of the introduction chamber, the growth chamber and the discharge chamber are disposed at predetermined positions, respectively, so that the molecular beam crystal growth can be effected in a clean room which is separated from a maintenance room.

1 Claim, 3 Drawing Sheets

MOLECULAR BEAM EPITAXY APPARATUS

This application is a continuation of application Ser. No. 894,864, filed on Aug. 8, 1986 now abandoned.

BACKGROUND OF THE INVENTION

1. Field of the Invention

This invention relates generally to a molecular beam epitaxy apparatus for forming a film on a substrate by molecular beam crystal growth, and more particularly to a molecular beam epitaxy apparatus which is especially suitable as an apparatus for mass production.

2. Description of the Prior Art

As one example of the prior art apparatuses, British Patent Laid-Open No. 2,095,704 discloses an apparatus which is directed to process a large number of substrates. However, when ten to twenty-five substrates are simultaneously loaded to a cassette (platen), this apparatus involves a problem that the diameter of the cassette is as great as 500 to 600 mm, the valve for dividing each chamber must be as great as a growth or analysis chamber and the size of the apparatus becomes great. Moreover, since introduction and discharge chambers are distributed with a main chamber being the center, the apparatus is not free from a problem, either, in that an operator of the apparatus cannot charge and discharge the substrates from the same operation position. Accordingly, this apparatus is not suitable for mass-production.

SUMMARY OF THE INVENTION

(1) Object of the Invention

It is therefore an object of the present invention to provide a molecular beam epitaxy apparatus which solves the problems with the prior art described above, can be installed easily at a position divided by a partition wall which divides a clean room from a maintenance room, and is suitable as an apparatus for mass production because it is compact in size.

(2) Statement of the Invention

In accordance with the present invention, there is provided a molecular beam epitaxy apparatus characterized in that transfer means for transferring substrates, which have been transferred from an introduction chamber, to a growth chamber and for transferring the substrates transferred from the growth chamber after growth to a discharge chamber consists of a rotary disc for supporting thereon a plurality of substrates and transferring them to the growth chamber and then to the discharge chamber, the introduction chamber is positioned within the range of rotation of the rotary disc from the start of its rotation (0°) to a point of ⅜ rotation (35°) and preferably, to a point of 2/8 rotation (90°), the growth chamber is positioned within the range of rotation of the rotary disc from the point of ⅜ rotation (35°) to a point of ⅝ rotation (225°) and the discharge chamber is positioned within the range of rotation from the point of ⅝ rotation to the start of rotation, and preferably from a point of 6/8 rotation (270°) to the start of rotation.

DESCRIPTION OF THE PREFERRED EMBODIMENTS

Figure 1A:
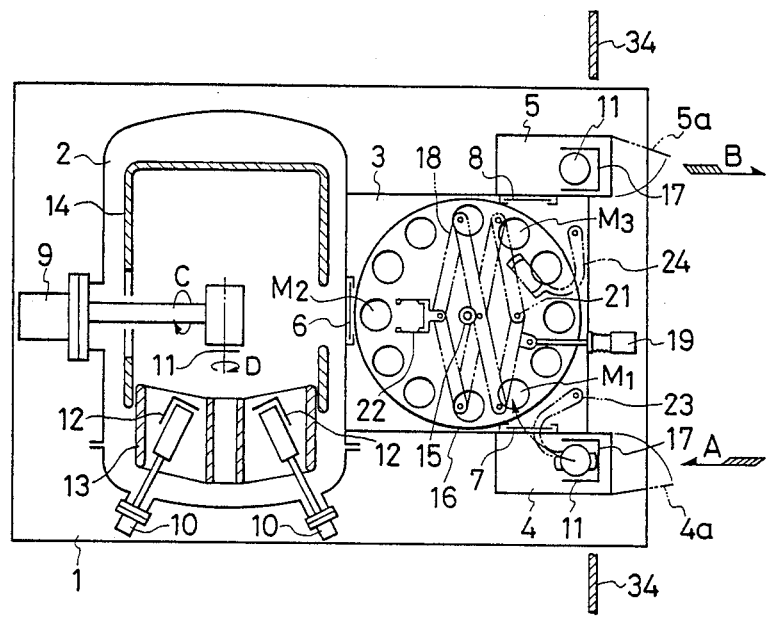
FIG. 1(a) is a plan view of a molecular beam epitaxy apparatus in accordance with one embodiment of the invention.

FIG. 1(a) is a plan view of one embodiment of the present invention. The apparatus is mounted on a base 1, and a molecular beam crystal growth chamber (hereinafter called the "growth chamber") 2, a transfer chamber 3, an introduction chamber 4 and a discharge chamber 5 are arranged on the base as shown in the drawing. Though the transfer chamber 3 in this embodiment is a square pole, it may be hexagonal prism so that the growth chamber 2, the introduction chamber 4 and the discharge chamber 5 can be disposed on each other side, or the introduction chamber 4 and the discharge chamber 5 may be disposed reversely.

Figure 1B:
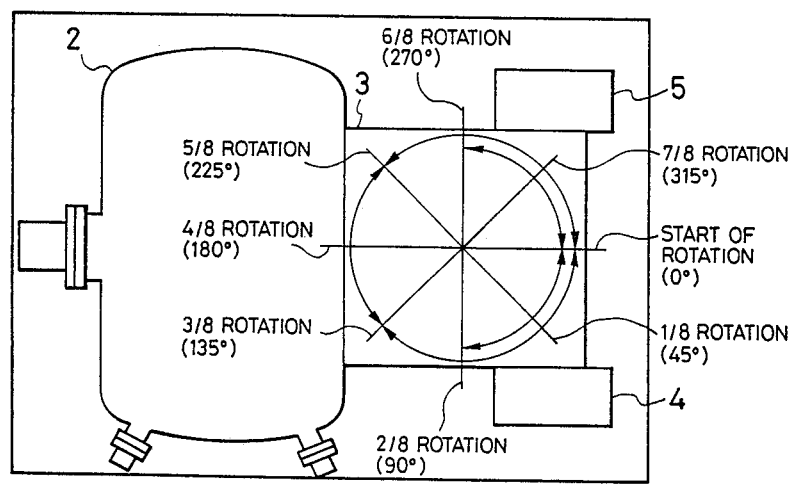
FIG. 1(b) is an explanatory view useful for explaining the rotation angle of a rotary disc in the molecular beam epitaxy apparatus of the invention.

FIG. 1(b) is a detailed view which is useful for explaining in detail the relation of position between the introduction chamber 4, the growth chamber 2 and the discharge chamber 5. The introduction chamber 4 is disposed within the range of from the start of rotation (0°) to a point of ⅜ rotation (135°) and preferably to a point of 2/8 rotation (90°), the growth chamber is disposed within the range of from the point of ⅜ rotation to a point of ⅝ rotation (225°) and the discharge chamber is disposed within the range of from the point of ⅝ rotation, preferably from a point of 6/8 rotation (270°), to the start of rotaton.

A vacuum exhaust system of each chamber is disposed substantially inside the base 1 (though the system is not shown in the drawing). The vacuum exhaust system comprises an appropriate combination of an ion pump, a turbo molecular pump, a cryopump, a titanium sublimation pump, an oil-sealed rotary pump, and the like.

The growth chamber 2 and the transfer chamber 3 are separated by a gate valve 6, the transfer chamber 3 and the introduction chamber 4 are separated by a gate valve 7 and the transfer chamber 3 and the discharge chamber 5 are separated by a gate valve 8. These chambers are closed and kept under vacuum independently of one another except when the substrates 11 are transferred to other chambers.

Incidentally, the vacuum pressure to be attained for each chamber is about $10^{-9}$ Pa for the growth chamber 2, about $10^{-8}$ Pa for the transfer chamber 3 and about $10^{-6}$ Pa for the introduction and discharge chambers 4 and 5.

A substrate holder 9 and a molecular beam source 10 are disposed inside the growth chamber 2. Six to ten molecular beam sources 10 are fitted as one set, though the number varies according to the application.

The substrate holder 9 is constructed such that it can revolve round the axis of the main body as the center (represented by an arrow C), can hold the substrates 11 and can rotate round its own axis (represented by an arrow D) so as to rotate the substrates 11. The position of revolution can be changed in accordance with the applications such as reception of the substrates, the molecular beam crystal growth and analysis. Its rotation is used for making uniform the film thickness of the molecular beam crystal growth.

Each molecular beam source 10 is equipped with a shutter 12 so that the molecular beam crystal growth can be controlled by opening and closing the shutter 12. The growth chamber 2 is equipped with shrouds 13 and 14 into which liquid nitrogen can be charged and which are free from contamination by excessive molecules evaporated from the molecular beam source 10.

Substrate support means 16 is disposed in the transfer chamber 3 in such a manner as to be capable of rotation with a bearing 15 as the center. The substrate support means 16 can support the substrates 11 the number of which is close to, or greater than, the number of substrates that the cassette 17 can carry. Accordingly, the substrates 11 that are charged into the introduction chamber 4 from the atmosphere are all transferred to the substrate support means 16 of the transfer chamber 3 immediately after the introduction chamber 4 is evacuated and then wait for the molecular beam crystal growth. As described already, since the vacuum pressure is lower in the transfer chamber 3 than in the introduction chamber 4, the effect of cleaning the substrates can be improved by separate heating means or the like.

Figure 2:
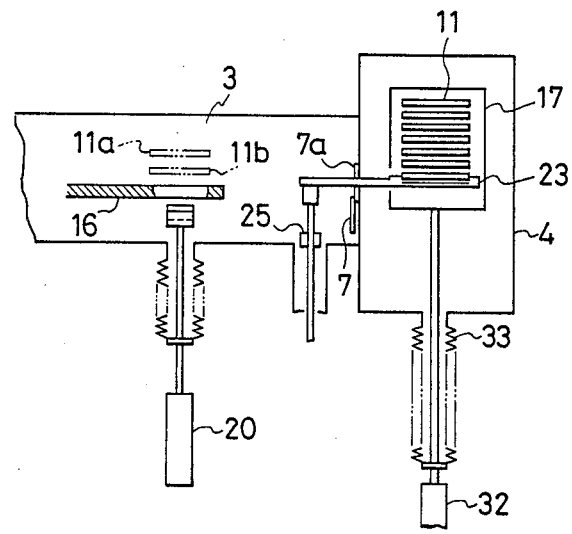
FIGS. 2 to 4 are detailed explanatory views useful for explaining in detail substrate transfer means in the molecular beam epitaxy apparatus of the invention.
Figure 4:
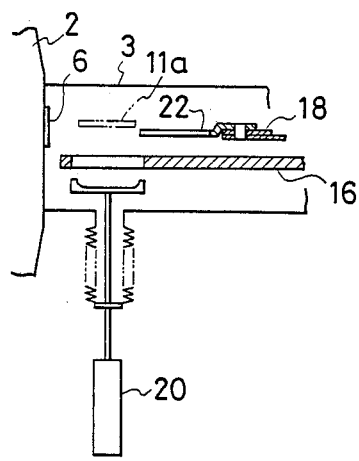

Substrate push-up means 20 shown in FIGS. 2 and 4 are pivotally disposed at three positions of the transfer chamber 3 represented by symbols M1 to M3, and a retractile substrate transfer mechanism 18 is disposed with a pin 21, which is fixed to the vessel of the transfer chamber 3, as the support point. The direction of retraction of the substrate transfer mechanism 18 is restricted by guide means or the like (not shown in the drawing) disposed separately. Swivel arms 23 and 24 are rotatably disposed at those positions which associate with the positions represented by symbols M1 and M3.

Figure 3:
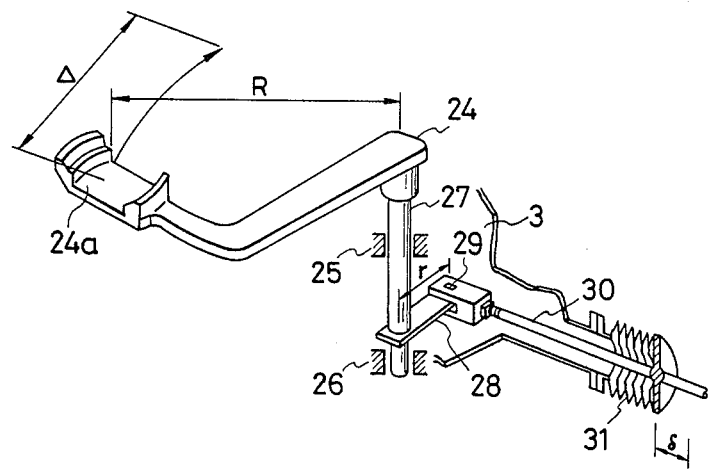

FIG. 2 is an explanatory view showing the transfer method of the substrates 11 from the introduction chamber 4 to the transfer chamber 3. The cassette 17 set to the introduction chamber 4 can be moved up and down intermittently in accordance with the pitch of disposition of the substrates 11 by an elevation mechanism through bellows 33. Guide rails (not shown in the drawing) or the like prevent the oscillation of the cassette 17. FIG. 3 shows a driving mechanism of the swivel arm 24, and the swivel arm 23 has the same construction but in an opposite direction. The swivel arm 24 has a substrate loading position 24a, and a shaft 27 is fixed to the other end of the swivel arm 24. The shaft 27 is supported by the bearings 25 and 26 and a lever 28 is fixed to the other end of the shaft 27. The lever 28 is supported by a pin 29 so as to be rotatable with the driving mechanism 30, which is communicated with the atmosphere through bellows 31 and is driven straight by an actuater (not shown in the drawing).

Here, a series of operations from the charge of the substrates 11 to discharge from the apparatus after completion of the molecular beam crystal growth will be described. Though the actuater and a sensor are omitted, the molecular beam epitaxy apparatus of the present invention can be operated fully automatically by the combination of the actuater using a pressurized fluid or electric power as its driving source and the sensor.

A predetermined number of substrates 11 that are set to the cassette in the atmosphere are set to a predetermined position for each cassette inside the introduction chamber 4 by opening the door 4a of the introduction chamber 4 whose pressure is returned to the atmospheric pressure, and then the door 4a is closed. Since the door 4a is frequently opened and closed, an elastomer such as fluororubber is used as seal means of the door 4a, for example. At this time the gate valves 6, 7, 8 are all kept closed and each chamber other than the introduction chamber 4 is kept vacuum.

Next, the introduction chamber 4 is evacuated and after the pressure is sensed to be below a predetermined pressure, the gate valve 7 is opened and the swivel arm 23 is rotated to the state shown in FIG. 1. Then, the cassette 17 is lowered to place the lowermost substrate 11 on the swivel arm 23. FIG. 2 shows the state where the lowermost substrate 11 is placed on the swivel arm 23. Thereafter the swivel arm 23 is returned to a position represented by the symbol M1. At this time, the substrate 11 exists at the position 11b. Next, the push-up mechanism 20 is operated to cut off the connection with the swivel arm 23 and after the swivel arm 23 rotates and retreats to the position symmetric with the swivel arm 24, the substrate 11 is delivered to the substrate support means 16 while the push-up mechanism is being lowered. Then, the substrate support means 16 is rotated by one pitch. This operation is repeated in the number of times corresponding to the number of substrates, whereby all the substrates 11 of the cassette 17 are transferred to the transfer chamber 3. After the gate valve 7 is closed, the introduction chamber 4 enters the waiting state for the introduction of the next substrate.

The substrate support means 16 is indexed at the position of each substrate and rotates and stops so that the substrate 11 which is to be subjected to the molecular beam crystal growth comes to the position of M2. Here, the push-up mechanism 20 shown in FIG. 4 pushes up the substrate 11 to the position 11a, extends to the position where the substrate support portion 22 of the transfer mechanism 18 comes to the position M2, once stops there, and transfers the substrate 11 to 22 by lowering the push-up mechanism 20. Then, after the gate valve 6 is opened, the transfer mechanism 18 is extended inside the growing chamber 2 to the position of delivery with respect to the rotary manipulator 9. At this time, the rotary manipulator 9 rotates (revolves) by 90° from the state shown in FIG. 1 so that the substrate fitting surface faces downward and faces the substrate 11 that is carried by the transfer mechanism 18. Next, the substrate 11 is pushed up to a suitable position by the push-up mechanism and is meshed with the rotary manipulator 9, and then the push-up mechanism is lowered so that the transfer mechanism 18 is returned to the original position and the gate valve 6 is closed. In this manner, the preparation for the molecular beam crystal growth is complete. In FIG. 1, the rotary manipulator 9 which receives the substrate 11 rotates by about 90° and effects the molecular beam crystal growth under the state shown in FIG. 1. After the molecular beam crystal growth is complete, the substrate 11 is returned from the growth chamber 2 to the position M2 by opposite means to the means for carrying the substrate into the rotary manipulator.

When the substrate 11 is immediately taken out, the substrate support means 16 is rotated so that the substrate 11 comes to the position M3, and then the take-out operation may be carried out. However, it is more reasonable from the respect of keeping vacuum to sequentially stock the substrates 11 after the molecular beam crystal growth in the substrate support means 16 and are then taken out altogether when processing of one cassette of substrates is complete. The sequence for taking out the substrates is substantially reverse to the take-in operation which is briefly as follows. Namely, the substrate 11 at the position M3 is lifted by the push-up mechanism 20 at the position M3, then the swivel arm 24 is rotated so as to receive the substrate 11 from the push-up mechanism 20, the gate valve 8 is opened and the swivel arm 24 is further rotated to deliver the substrates 11 to the discharge chamber 5. The difference of this operation from the operation in the introduction chamber 4 is that since the cassette 17 pushes up and receives the substrate 11 from below the swivel arm 24, the cassette 17 receives the substrates 11 from its upper stage side.

In accordance with the embodiment described above, the introduction chamber 4 and the discharge chamber 5 are disposed in such a fashion that they can be divided easily from the growth chamber 2 by the partition wall so that the so-called "through-the-wall" of the molecular beam epitaxy apparatus can be disposed easily. Even when baking treatment is applied to both the growth chamber and the transfer chamber in order to obtain ultra-high vacuum, the dust generated thereby can be confined in the maintenance room and the introduction and discharge of the substrates into and from the apparatus can be always carried out in the clean room. Moreover, since the transfer means of the substrates consists of the rotary disc, the apparatus can be made compact (or the floor area for installation can be reduced by about a half).

Incidentally, the relation of position between the introduction chamber 4 and the discharge chamber 5 may be reverse to that of the embodiment described above. In such a case, producibility somewhat drops but the other effects remain the same as those of the embodiment described above.

Furthermore, the ratio of the length (r) of the lever on the driving side to the length (R) of the arm on the transfer side is intentionally set to an extremely aarge ratio so that the moving quantity δ of the driving portion can be minimized with respect to the necessary transfer quantity Δ, and the discharge quantity can be reduced by the extension and contraction of the bellows.

Figure 5:
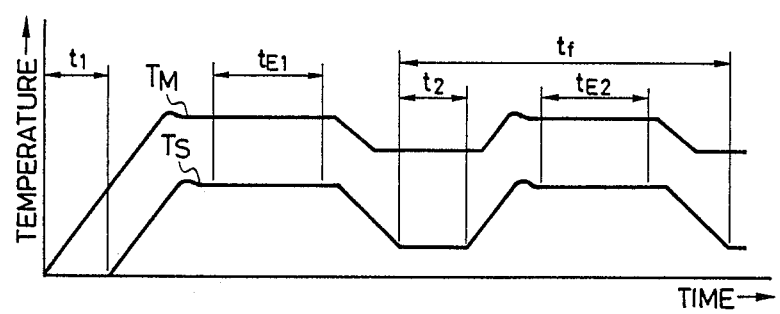
FIG. 5 is an explanatory view useful for explaining the crystal growth process in the molecular beam epitaxy apparatus of the present invention.

FIG. 5 is a diagram which is useful for explaining the process for the molecular beam crystal growth by a typical temperature $T_M$ of the molecular beam source and a substrate temperature $T_S$. After temperature elevation of the molecular beam source is started, the substrate is received by the rotary manipulator and the substrate temperature is then raised (the sequence may be reverse).

Here, a time $t_1$ represents a substrate delivery time. When the temperatures $T_M$ and $T_S$ reach the predetermined steady values, respectively, the molecular beam crystal growth is effected ($t_{E1}$) and after it is complete, the temperature $T_M$ of the molecular beam source is somewhat lowered or kept as such to wait for the next molecular beam crystal growth. On the other hand, the substrate temperature is lowered to a level where no problem occurs for the transfer operation. (It is not necessary to reduce the temperature to its original temperature.) Then, the substrate is replaced by a next substrate ($t_2$). After the temperature of the second substrate is raised and after the predetermined temperature condition is established, the molecular beam crystal growth is effected ($t_{E2}$). Since the processing period $t_f$ of this second substrate is repeated, the molecular beam epitaxy apparatus of the present invention becomes fully automatic including not only the transfer operation of course but also the molecular beam crystal growth process.

What is claimed is:

1. A molecular beam epitaxy apparatus including:

a growth chamber for effecting molecular beam crystal growth;

an introduction chamber for introducing a substrate thereinto;

a cassette for storing a plurality of said substrates in said introduction chamber;

a discharge chamber for discharging said substrate after the growth;

gate valve means for opening and closing said growth, introduction and discharge chambers disposed in the same plate;

a transfer chamber;

transfer means for transferring said substrate from said introduction chamber to said growth chamber after the growth to said discharge chamber; wherein said transfer means is disposed in said transfer chamber to communicate with said growth chamber, said introduction chamber, and said discharge chamber and comprises a rotary disc which supports thereon a plurality of said substrates equal to or greater than the number of said substrates stored by said cassette and transfers them in a horizontal direction to said growth chamber and then to said discharge chamber, a retractile substrate transfer bar linkage rotatably supported on a pin fixed in said transfer chamber for transferring one of said substrates from said transfer chamber into said growth chamber for molecular beam crystal growth and thereafter returning said one of said substrates after growth to said rotary disc, said bar linkage being provided at one end in proximity to said growth chamber with a substrate support means for transferring said one of said substrates to and from said growth chamber, said introduction chamber is fitted to a position within the range of rotation of said rotary disc from the start of rotation to a point of 2/8 rotation, said growth chamber is positioned within the range of rotation of said rotary disc from the point of ⅜ rotation to a point of ⅝ rotation, and said discharge chamber is positioned within the range of rotation of said rotary disc from the point of 6/8 rotation to the start of rotation, said growth, introduction, discharge and transfer chambers being operatively arranged such that a door for feeding a substrate into said introduction chamber and a door for taking said substrate out from said discharge chamber are arranged in a straight line in their closed condition, whereby in their open condition said substrate is fed into said introduction chamber in a direction opposite to the taking of said substrate from said discharge chamber, and both doors projecting from a wall surface of said transfer chamber remote from said growth chamber; and a first swivel means pivoted in said transfer chamber for transferring said one of said substrates from said introduction chamber to said transfer chamber and a second swivel means for transferring said one of said substrates after the growth from said transfer chamber to said discharge chamber, said first and second swivel means being associated respectively with said introduction chamber and said discharge chamber and comprising swivel arms, shafts attached at one end thereof the swivel arms and supported at the other end thereof by bearing means, and driving mechanisms operatively connected to the shafts for actuating the swivel arms such that the swivel arm associated with said introduction chamber is pivoted to said cassette after said gate valve means associated with said introduction chamber is closed and is thereafter pivoted to a position where a substrate can be supported on said rotary disc and the swivel arms associated with said discharge chamber is pivoted to move a substrate after the growth from said rotary disc to said discharge chamber after said gate valve means associated with said discharge chamber is opened.

* * * * *